(12) United States Patent
Nakashima

(10) Patent No.: US 11,029,332 B2
(45) Date of Patent: Jun. 8, 2021

(54) TEST SOCKET WITH INSERTION PORTION

(71) Applicant: Yamaichi Electronics Co., Ltd., Tokyo (JP)

(72) Inventor: Kouki Nakashima, Tokyo (JP)

(73) Assignee: Yamaichi Electronics Co., Ltd., Tokyo (JP)

( * ) Notice: Subject to any disclaimer, the term of this patent is extended or adjusted under 35 U.S.C. 154(b) by 148 days.

(21) Appl. No.: 16/372,284

(22) Filed: Apr. 1, 2019

(65) Prior Publication Data

US 2019/0346483 A1    Nov. 14, 2019

(30) Foreign Application Priority Data

May 8, 2018   (JP) .............................. JP2018-089888

(51) Int. Cl.
   G01R 1/04        (2006.01)
   G01R 31/28       (2006.01)

(52) U.S. Cl.
   CPC ....... G01R 1/0466 (2013.01); G01R 31/2891 (2013.01)

(58) Field of Classification Search
   CPC .. H01R 12/52; H01R 12/523; H01R 13/6315; H01R 4/027; H01R 12/714; H01R 12/89; H01R 12/7082; H01R 12/62; H01R 12/73; H01R 4/64; H01R 12/79; H01R 13/193; H01R 24/58; H01R 13/11; H01R 13/627; H01R 12/57; H01R 12/7076; H01R 13/2442; H01R 13/518; H01R 13/2421; H01R 13/631; H01R 13/635; H01R 13/6473; H01R 24/50; G01R 1/0466; G01R 1/07357; G01R 1/06711; G01R 31/2886; G01R 1/07342; G01R 1/0483; G01R 1/07378; G01R 31/2889; G01R 1/07314; G01R 31/2863; G01R 1/0433;

(Continued)

(56) References Cited

U.S. PATENT DOCUMENTS 4,671,590 A  *  6/1987  Ignasiak .............. G01R 1/0425
                                              439/266
4,817,273 A  *  4/1989  Lape .................. G01R 31/2867
                                              29/741

(Continued)

FOREIGN PATENT DOCUMENTS

JP    2006351428 A    12/2006
JP    2013008499 A     1/2013

*Primary Examiner* — Vinh P Nguyen
(74) *Attorney, Agent, or Firm* — Hamilton, Brook, Smith & Reynolds, P.C.

(57) ABSTRACT

The test socket includes: a pressing body for pressing an IC package housed in a device housing portion in a direction toward a board; a lid-part main body holding the pressing body while allowing reciprocating movement in the direction toward and from the board, and to be connected to a housing-part main body; a stopper attached at an intermediate point to the lid-part main body so that the stopper is swingable, the stopper having an engaging portion 5a coming into engagement with the housing-part main body, and a proximal end portion approaching and separating from a side surface of the lid-part main body; and an insertion portion to be inserted into a gap between the proximal end portion and the side surface of the lid-part main body according to an action of the pressing body pressing the IC package in the direction toward the board.

8 Claims, 10 Drawing Sheets

(58) Field of Classification Search
CPC ............ G01R 1/07307; G01R 31/2891; G01R 31/2893; G01R 31/2867; G01R 1/045; H05K 1/141; H05K 7/1069; H05K 2201/10378; H05K 3/3436; H05K 2201/10424; H05K 2201/1031; H05K 2201/10878; H05K 2201/10545; H05K 1/181; H05K 2201/10325; H05K 2201/10598; H05K 3/301; H05K 2201/1053; H05K 2201/09745; G06F 1/183; A61N 1/3752

See application file for complete search history.

(56) References Cited

U.S. PATENT DOCUMENTS

| | | | | |
|---|---|---|---|---|
| 5,139,437 | A * | 8/1992 | Ikeya | G01R 1/0433 439/266 |
| 5,360,348 | A * | 11/1994 | Johnson | G01R 1/0433 439/330 |
| 6,086,387 | A * | 7/2000 | Gallagher | G01R 1/0483 439/331 |
| 6,152,744 | A * | 11/2000 | Maeda | G01R 1/0483 439/331 |
| 8,044,673 | B1 * | 10/2011 | Burgyan | G01R 1/0466 324/750.16 |
| 8,388,365 | B2 * | 3/2013 | Takahashi | H01R 12/7082 439/331 |
| 10,495,688 | B1 * | 12/2019 | Lopez | G01R 31/2891 |

\* cited by examiner

TEST SOCKET WITH INSERTION PORTION

RELATED APPLICATION

This application claims priority under 35 U.S.C. § 119 or 365 to Japanese Application No. 2018-089888, filed May 8, 2018. The entire teachings of the above application are incorporated herein by reference.

BACKGROUND

Background Art

In general, for an electronic device such as an IC package to be mounted on electronic equipment or the like, a test for eliminating latent defects is performed using a test socket prior to mounting the electronic device on a wiring board. For example, as disclosed in Japanese Unexamined Patent Applications, Publication No. 2006-351428 (PTL 1) and No. 2013-8499 (PTL 2), a test socket is used for a test in a state in which the test socket is mounted on a printed circuit board (board) as a test board or a packaging board.

CITATION LIST

Patent Literatures

[PTL 1] Japanese Unexamined Patent Application, Publication No. 2006-351428
[PTL 2] Japanese Unexamined Patent Application, Publication No. 2013-8499

SUMMARY

Technical Problems

After housing an IC package as a test device in the main body, a lid part is placed to retain the IC package in a pressed state, thereby bringing the test socket into a testable state. The test socket is provided with contact terminals at positions corresponding to the contacts of the IC package, and conductivity is established between the contacts of the IC package and a circuit board through the contact terminals.

Moreover, in this type of test socket, the contacts of the IC package housed in the main body and the contact terminals need to be in contact with each other in an appropriate pressed state. Therefore, in PTL 1 and PTL 2, in order to fasten the lid part to the main body while retaining an appropriate pressed state, a lock lever having an engaging portion at the distal end is employed in a portion of the lid part.

When the IC package has more than 1000 contacts, a great pressing force is required to press all the contact terminals and to reliably achieve conduction. For example, in the case where 0.25 N is required as the pressing force for a single contact terminal, when the number of contacts is 1000, a pressing force of 0.25×1000=250 N is required. Therefore, in PTL 1, after placing the lid part, by turning a screw-type pressing member provided in the lid part and pushing the package with the pressing member, the contacts and the contact terminals have an appropriate contact pressure.

In the test socket described in PTL 1, before removing the IC package after a test, it is necessary to perform depressurization by turning the pressing member in a depressurizing direction and then release the lock lever to remove the IC package. However, there is a possibility that the lock lever may be released by a mistaken manipulation of an operator while the IC package is still in the pressed state. When the lock lever is released in the pressed state, if a great pressing force is being applied as described above, there is a possibility that the lid part will open and the IC package will pop out and damage the IC package and the test socket. Furthermore, since the lid will open vigorously, there is a risk of damaging fingers and the like.

The present invention has been made in view of such circumstances, and it is an object of the present invention to provide a test socket capable of preventing a mistaken manipulation by which the pressed state is unintentionally released when the test device is in the pressed state.

Solution to Problems

A test socket according to one aspect of the present invention includes: a housing-part main body formed with a device housing portion for housing a test device and to be mounted on a board; a pressing body pressing the test device housed in the device housing portion in a direction toward the board; a lid-part main body holding the pressing body while allowing reciprocating movement in the direction toward and from the board, and to be connected to the housing-part main body; an engaging member attached to the lid-part main body so that the engaging member is swingable with an intermediate point as a pivot axis, the engaging member having a distal end portion coming into engagement with the housing-part main body, and a proximal end portion approaching and separating from an opposing surface of the lid-part main body; and an insertion portion to be inserted into a gap between the proximal end portion and the opposing surface according to an action of the pressing body pressing the test device in the direction toward the board.

The engaging member engages with the housing-part main body at the distal end portion, thereby connecting the lid-part main body and the housing-part main body. Since the engaging member is attached in a swingable fashion at the intermediate point to the lid-part main body, the proximal end portion of the engaging member is separated from the opposing surface when the distal end portion is in engagement with the housing-part main body. In this state, a gap is formed between the proximal end portion and the opposing surface of the lid-part main body. The insertion portion is inserted into the gap, and the insertion portion is inserted according to the action of the pressing body pressing the test device. Consequently, since the movement of the proximal end portion approaching toward the opposing surface of the lid-part main body is restricted, the distal end portion of the engaging member also cannot move and is kept in engagement with the housing-part main body. Hence, it is possible to prevent a mistaken manipulation by which the engagement of the engaging member is released and the housing-part main body and the lid-part main body are unintentionally separated from each other during pressing with the pressing body, that is, during a test of the test device.

Moreover, in the test socket according to one aspect of the present invention, the insertion portion is provided on a reciprocating member, the reciprocating member being fastened to reciprocate together with the pressing body.

The reciprocating member is provided to reciprocate together with the pressing body, and the insertion portion is provided on the reciprocating member. Thus, by just adding the reciprocating member, it is possible to prevent a mistaken manipulation by which the engaging member is unintentionally disengaged during pressing.

Further, in the test socket according to one aspect of the present invention, the reciprocating member is placed so that the lid-part main body is interposed between the reciprocating member and the pressing body, and includes a plate-like body extending in a direction orthogonal to a reciprocating direction, and a connecting member connecting and fastening the plate-like body and the pressing body together.

The reciprocating member is constructed by placing the plate-like body extending in the direction orthogonal to the reciprocating direction so that the lid-part main body is interposed between the plate-like body and the pressing body. Consequently, since the pressing body, the plate-like body and the lock part can be placed in a stacked manner, the test socket can be compactly configured without a significant change in the outer shape.

It is preferable that the connecting member for fastening the plate-like body to the pressing body be arranged to penetrate the lid-part main body. Accordingly, the test socket can be more compactly configured.

Further, in the test socket according to one aspect of the present invention, the lid-part main body includes a housing recess housing the pressing body.

By forming the housing recess housing the pressing body, the test socket can be compactly configured.

Furthermore, the test socket according to one aspect of the present invention further includes: a manipulating member having a tip in contact with the pressing body, and displacing the pressing body in the direction toward the board by manipulation of a knob part; and an intermediate member provided between the knob part of the manipulating member and the lid-part main body, and contacting the knob part, wherein the insertion portion is provided on the intermediate member.

The tip portion of the manipulating member is in contact with the pressing body. In this state, by manipulating the knob part of the manipulating member manually or the like, the pressing body is displaced in the direction toward the board. Thus, the manipulating member is displaced together with the pressing body in the direction toward the board. The intermediate member contacting the knob part of the manipulating member is provided between the manipulating member and the lid-part main body. Moreover, the insertion portion is provided on the intermediate member. Hence, the insertion portion provided on the intermediate member can be inserted into the gap between the proximal end portion of the engaging member and the lid-part main body according to the action of the manipulating member, thereby preventing a mistaken manipulation by which the engaging member is unintentionally disengaged during pressing.

Further, the test socket according to one aspect of the present invention further includes a manipulating member having a tip in contact with the pressing body, and displacing the pressing body in the direction toward the board by manipulation of a knob part, wherein the insertion portion is formed on the knob part of the manipulating member.

The tip portion of the manipulating member is in contact with the pressing body. In this state, by manipulating the knob part of the manipulating member manually or the like, the pressing body is displaced in the direction toward the board. Thus, the manipulating member is displaced together with the pressing body in the direction toward the board. The insertion portion is formed on the knob part of the manipulating member. Hence, the insertion portion can be inserted into the gap between the proximal end portion of the engaging member and the lid-part main body during pressing, thereby preventing a mistaken manipulation by which the engaging member is unintentionally disengaged during pressing.

Moreover, since the insertion portion is formed on the knob part of the manipulating member, the insertion portion can be realized without introducing a separate component part, thereby reducing the number of component parts.

Further, in the test socket according to one aspect of the present invention, the lid-part main body is provided with a toggle clamp for pressing the pressing body, and the insertion portion is provided on a lever part of the toggle clamp.

By providing the toggle clamp on the lid-part main body, the pressing body is pressed in the direction toward the board. The insertion portion is provided on the lever part of the toggle clamp. Hence, when the pressing body is pressed by the toggle clamp, the insertion portion provided on the lever part can be inserted into the gap between the proximal end portion of the engaging member and the lid-part main body, thereby preventing a mistaken manipulation by which the engaging member is unintentionally disengaged during pressing.

Furthermore, the test socket according to one aspect of the present invention further includes a contact terminal for electrically connecting the test device and the board, wherein the pressing body is conductive, and the insertion portion is inserted into the gap from a contact position where the pressing body contacts the contact terminal when the test device is not mounted in the device housing portion, for a period of time until the pressing body is separated and disconnected from the contact terminal.

In the case where the test device is not housed in the device housing portion, the contact terminal and the pressing body may come into direct contact with each other. At this time, if the pressing body is conductive, there is a possibility of occurrence of a short circuit between the contact terminal and the board through the pressing body. Therefore, the insertion portion is kept inserted into the gap from the contact position where the pressing body contacts the contact terminal when the test device is not mounted in the device housing portion, for a period of time until the pressing body is separated and disconnected from the contact terminal. Hence, it is possible to prevent a short circuit and avoid breakage of the test socket and the board.

Advantageous Effects of Invention

Since swinging of the engaging member is restricted by the insertion portion, it is possible to prevent a mistaken manipulation by which the pressed state is unintentionally released when the test device is in the pressed state.

BRIEF DESCRIPTION OF THE DRAWINGS

The foregoing will be apparent from the following more particular description of example embodiments, as illustrated in the accompanying drawings in which like reference characters refer to the same parts throughout the different views. The drawings are not necessarily to scale, emphasis instead being placed upon illustrating embodiments.

DETAILED DESCRIPTION

A description of example embodiments follows.

First Embodiment

Hereinafter, the first embodiment of a test socket of the present invention will be described with reference to the drawings.

Figure 1:
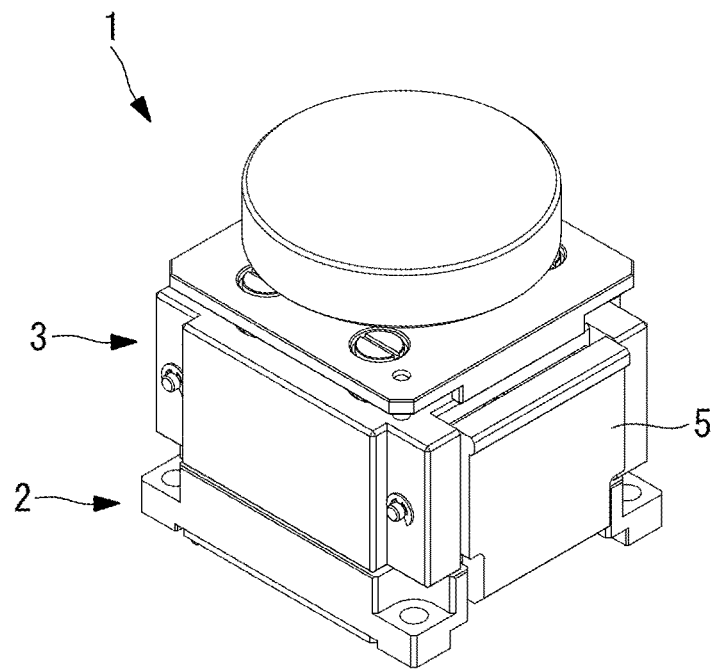
FIG. 1 is a perspective view showing a socket according to a first embodiment of the present invention.

FIG. 1 shows a test socket 1 (hereinafter simply referred to as the "socket 1"). For example, the socket 1 is placed on a printed wiring board as a test board (hereinafter simply referred to as the "board 7", see reference sign 7 in FIG. 2).

The socket 1 includes a housing-part main body 2 to be mounted on the board 7, and a lid part 3 to be connected to the housing-part main body 2. The lid part 3 is mounted to cover the top of the housing-part main body 2. The lid part 3 is provided with a stopper 5. The housing-part main body 2 and the lid part 3 are fastened together by the stopper (engaging member) 5 so as not to be separated.

A test device such as an IC package is inserted and mounted in the housing-part main body 2. As the IC package, for example, a BGA (Ball Grid Array) type is used. As other IC packages, for example, LGA (Land Grid Array) type and QFN (Quad Flat Non-leaded package) type are used.

Figure 2:
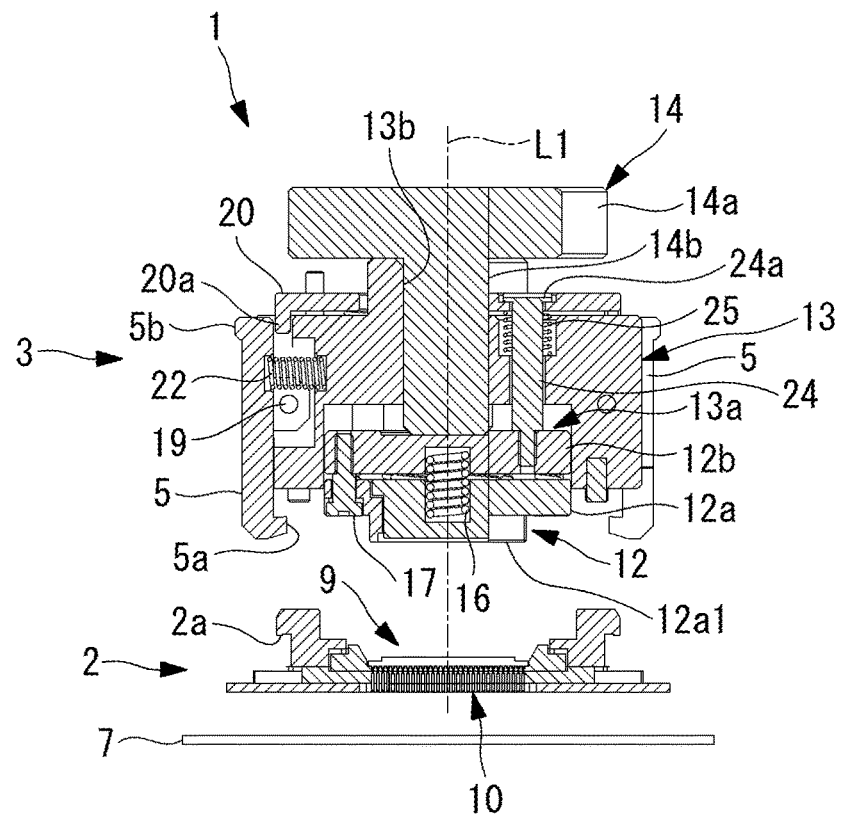
FIG. 2 is a vertical cross section of the socket of FIG. 1, and is a cross-sectional view taken along line II-II of FIG. 3.
Figure 3:
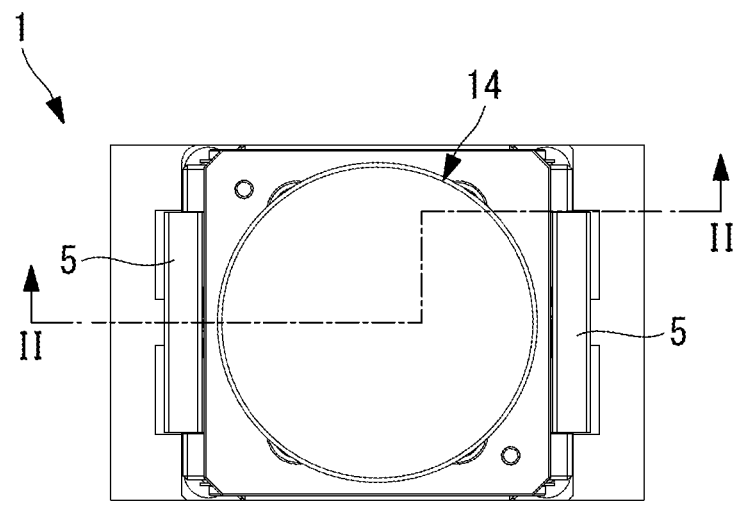
FIG. 3 is a plan view of the socket of FIG. 1.

FIG. 2 shows a state in which the board 7, the housing-part main body 2 and the lid part 3 are separated. FIG. 2 is a cross-sectional view taken along the line II-II of FIG. 3 showing a plan view of the socket 1.

In this embodiment, the housing-part main body 2 is made of a metal such as aluminum, and a device housing portion 9 for housing an IC package is formed as a recess at the center. Under the device housing portion 9, a plurality of contact terminals 10 are juxtaposed to extend in the vertical direction. The contact terminals 10 enable conduction between the board 7 and the IC package. Each contact terminal 10 houses a spring therein and allows an upper end and a lower end to advance and retract. The number and arrangement of the contact terminals 10 correspond to the number and arrangement of the contacts of the IC package to be tested. Instead of such a probe pin type contact terminal, a leaf spring type contact terminal may also be adopted.

The lid part 3 includes a pressing body 12 which contacts and presses the IC package in the direction toward the board 7, a lid-part main body 13 holding the pressing body 12, and a manipulating member 14 for manipulating a pressing action of the pressing body 12.

In this embodiment, the pressing body 12 is formed of a conductive material such as aluminum. The pressing body 12 includes a lower pressing body 12a having a lower surface 12a1 that is a contact surface to be brought into contact with the IC package, and an upper pressing body 12b connected to the top of the lower pressing body 12a. A coil spring 16 (compression coil spring) having an axis in the vertical direction is provided between the lower pressing body 12a and the upper pressing body 12b. A predetermined gap is formed between the upper pressing body 12b and the lower pressing body 12a by the elastic force of the coil spring 16. The maximum amount of this gap is regulated by a stopper bolt 17. The upper pressing body 12b and the lower pressing body 12a are guided by the stopper bolt 17 and can approach each other against the elastic force of the coil spring 16. Thus, when a pressing force of a predetermined value or more is applied to the IC socket, the upper pressing body 12b and the lower pressing body 12a approach each other, thereby preventing overload.

On the lower surface of the lid-part main body 13, a storage recess 13a is formed to open downward. The upper pressing body 12b and the lower pressing body 12a are stored so that the upper pressing body 12b and the lower pressing body 12a can reciprocate in the vertical direction in the storage recess 13a formed in the lid-part main body 13.

The stopper 5 is provided on each of both sides of the lid-part main body 13. The stopper 5 is attached to the lid-part main body 13 so that the stopper 5 can swing about the pin 19 provided at an intermediate point in the longitudinal direction of the stopper 5. At the lower end (the distal end) of the stopper 5, an engaging portion 5a protruding toward the lid-part main body 13 is provided. The engaging portion 5a engages with an engaged portions 2a provided on each of both side surfaces of the housing-part main body 2.

A proximal end portion 5b, which is the upper end portion of the stopper 5, approaches and separates from the side surface (opposing surface) of the opposing lid-part main body 13. That is, when the engaging portion 5a of the stopper 5 is at a position engaging with the engaged portion 2a, the proximal end portion 5b of the stopper 5 is at a position separated from the side surface of the lid-part main body 13, and a gap G (see FIG. 5) is formed. An insertion portion 20a provided in a lock part 20 is inserted into the gap G.

Figure 4:
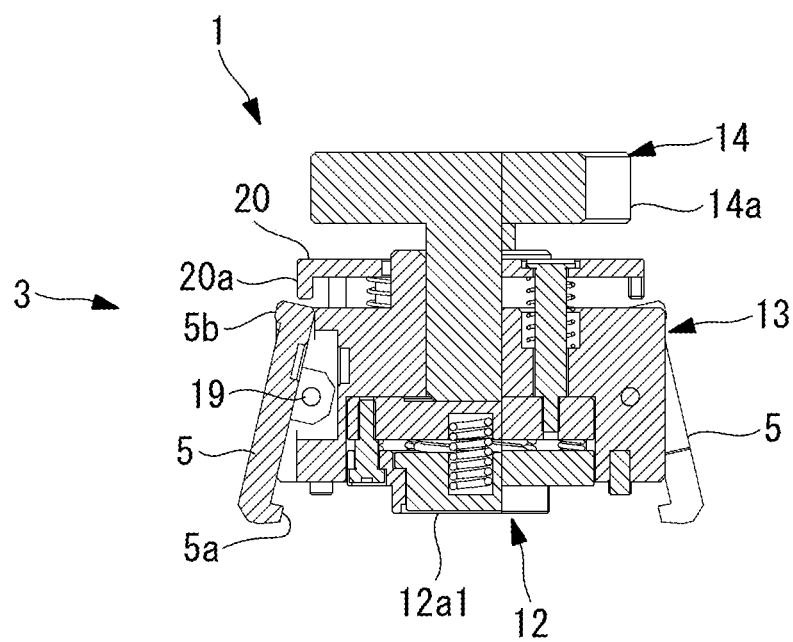
FIG. 4 is a vertical cross-sectional view of a lid part showing a state in which stoppers are released.

On the other hand, when the engaging portion 5a of the stopper 5 is disengaged from the engaged portion 2a, the stopper 5 swings about the pin 19 as shown in FIG. 4, and therefore the proximal end portion 5b is at a position approaching the side surface of the lid-part main body 13. In this state, since the gap between the proximal end portion 5b and the side surface of the lid-part main body 13 is smaller, the insertion portion 20a provided on the lock part 20 cannot be inserted.

As shown in FIG. 2, a coil spring 22 is provided above the pin 19 but below the proximal end portion 5b. The coil spring 22 is formed of a compression spring, placed in a posture with the axis line being along a substantially horizontal direction, and interposed between the stopper 5 and the side surface of the lid-part main body 13. The elastic force of the coil spring 22 urges the engaging portion 5a at the lower end of the stopper 5 so that the engaging portion 5a is positioned on the engaged portion 2a side.

The manipulating member 14 includes an upper knob part 14a, and a shaft part 14b extending along a center axis line L1. The knob part 14a is in a substantially disk shape extending horizontally, and is turned about the center axis line L1 by the hand of the user. The shaft part 14b is fastened on a lower surface of the knob part 14a, and has a cylindrical shape coaxial with the knob part 14a. A threaded hole 13b in which the shaft part 14b is fastened is provided at the center of the lid-part main body 13. The shaft part 14b is provided to penetrate the lid-part main body 13 through the threaded hole 13b. The lower end of the shaft part 14b abuts against an upper surface of the pressing body 12 (specifically, the upper surface of the upper pressing body 12b). A male thread is formed on the outer circumferential surface of the shaft part 14b and is engaged with a female thread formed on the inner circumferential surface of the lid-part main body 13. Thus, by turning the knob part 14a about the center axis line L1, it is possible to advance and retract the lower end of the shaft part 14b with respect to the pressing body 12.

The lock part (reciprocating member) 20 for regulating the swing of the stopper 5 is provided between the knob part 14a and the lid-part main body 13. The lock part 20 is a plate-like body extending in the horizontal direction, and an insertion portion 20a protruding downward is integrally formed on each of both side surfaces (the left and right ends in FIG. 2). The insertion portion 20a is insertable into the gap G between the proximal end portion 5b of the stopper 5 and the side surface of the lid-part main body 13.

The lock part 20 and the pressing body 12 are connected with a step bolt (connecting member) 24. A male thread is formed on the lower end of the step bolt 24 and is engaged with a female thread formed in the upper pressing body 12b. An intermediate point of the step bolt 24 penetrates the lid-part main body 13. An enlarged diameter portion 24a having a larger diameter than the lower portion is provided in the upper portion of the step bolt 24. The enlarged diameter portion 24a is engaged with a stepped hole formed in the lock part 20 so that the enlarged diameter portion 24a is allowed to move relatively higher than the lock part 20 while being restricted from moving relatively lower than the lock part 20.

A coil spring 25 is provided to surround the step bolt 24. The coil spring 25 is stored in a recess formed in the lid-part main body 13. An upper end of the coil spring 25 abuts against the lower surface of the lock part 20. The coil spring 25 urges the lock part 20 to separate upward from the lid-part main body 13. Four pairs of step bolt 24 and coil spring 25 are provided symmetrically with respect to the center axis line L1. Consequently, the pressing body 12 and the lock part 20 are smoothly moved with respect to the lid-part main body 13. It should be noted that the number of pairs of step bolt 24 and coil spring 25 can be two or more. Further, in this embodiment, although the step bolt 24 and the coil spring 25 are arranged coaxially, the step bolt 24 and the coil spring 25 may be arranged separately.

Next, states of actions of the above-described socket 1 will be described.

[Stopper (Closed), Manipulating Member (Not Pressing)]

Figure 5:
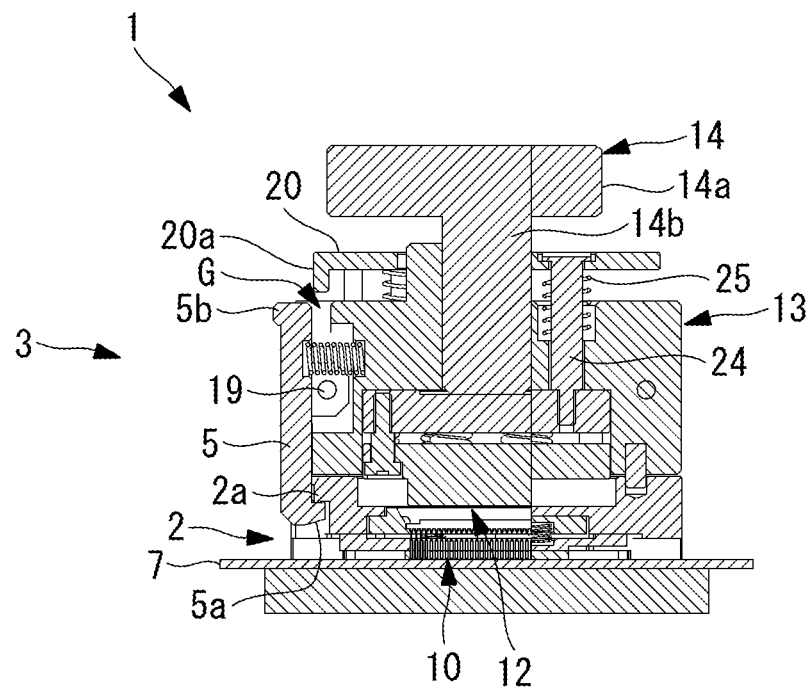
FIG. 5 is a vertical cross-sectional view in which the stopper is in a closed state and a manipulating member is in a retracted state.

FIG. 5 shows a state in which the stopper 5 is in a closed state, that is, the engaging portion 5a engages with the engaged portion 2a and is in a locked state, and the manipulating member 14 is retracted upward and is not pressing an IC package that is a test device.

Since the stopper 5 is in the closed state, the lid-part main body 13 is in a state of being coupled with the housing-part main body 2. Meanwhile, the manipulating member 14 is retracted upward. The pressing body 12 connected through the step bolt 24 is also pushed upward by the urging force of the coil spring 25, and the pressing body 12 and the IC package are in the state of being separated from each other. The state of FIG. 5 is a pre-test state of the IC package.

[Stopper (Closed), Manipulating Member (Pressing)]

Figure 6:
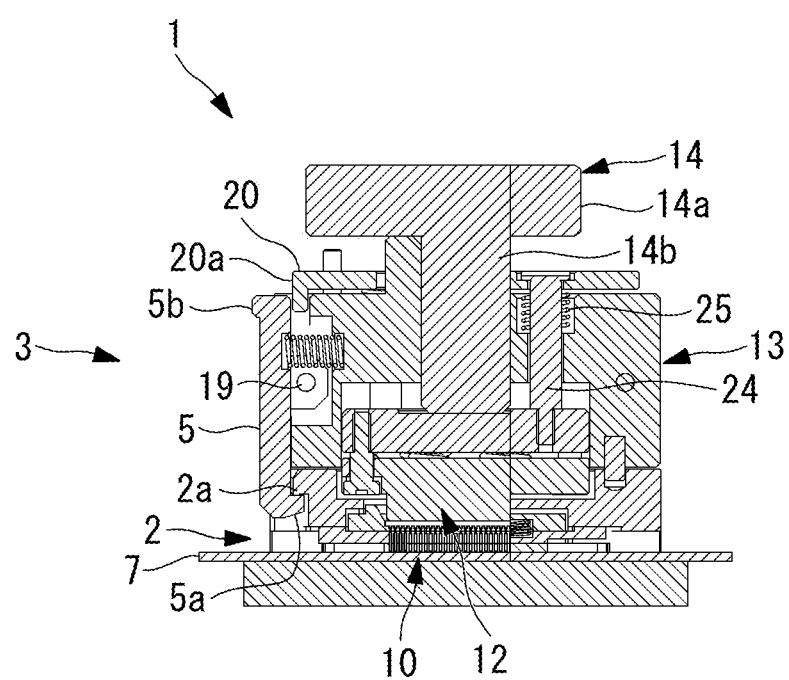
FIG. 6 is a vertical cross-sectional view in which the stopper is in a closed state and the manipulating member is in a pressing state.

FIG. 6 shows a state in which the stopper 5 is in a closed state, and the manipulating member 14 advances downward and presses the IC package that is a test device. The state shown in FIG. 6 is a test state for testing the IC package.

The user manipulates the knob part 14a to advance the lower end of the shaft part 14b downward and press the pressing body 12 downward. Consequently, the IC package is pressed against the board 7 with a predetermined pressing force, thereby obtaining a desired conductive state. With the action of downward displacement of the pressing body 12, the lock part 20 also moves downward because the pressing body 12 and the lock part 20 are connected together with the step bolt 24. With this action, the insertion portion 20a of the lock part 20 is inserted into the gap G between the proximal end portion 5b of the stopper 5 and the side surface of the lid-part main body 13. In this state, since the swing of the stopper 5 is restricted by the insertion portion 20a, the engagement state between the engaging portion 5a and the engaged portion 2a is not released.

Figure 8:
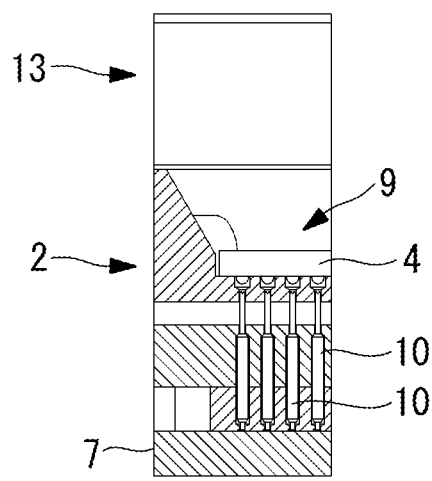
FIG. 8 is a partially enlarged vertical cross-sectional view showing a state in which an IC package is mounted in a device housing portion.
Figure 9:
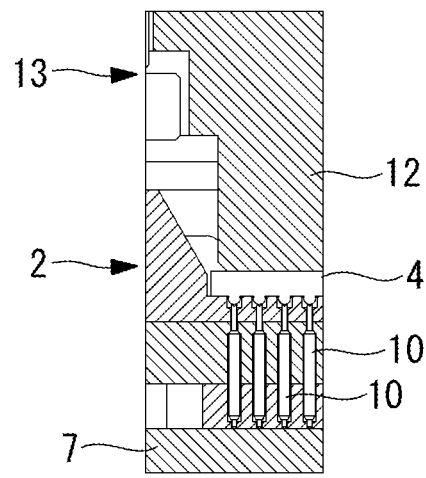
FIG. 9 is a partially enlarged vertical cross-sectional view showing a state in which the IC package mounted in the device housing portion is pressed by a pressing body.

FIG. 8 shows a state in which an IC package 4 is housed in the device housing portion 9 of the housing-part main body 2. From this state, by pushing down the pressing body 12 as described above, the pressing body 12 presses the IC package 4 downward as shown in FIG. 9. Consequently, each contact of the IC package 4, each contact terminal 10 and the board 7 are reliably conductive.

[Stopper (Open), Manipulating Member (Not Pressing)]

Figure 7:
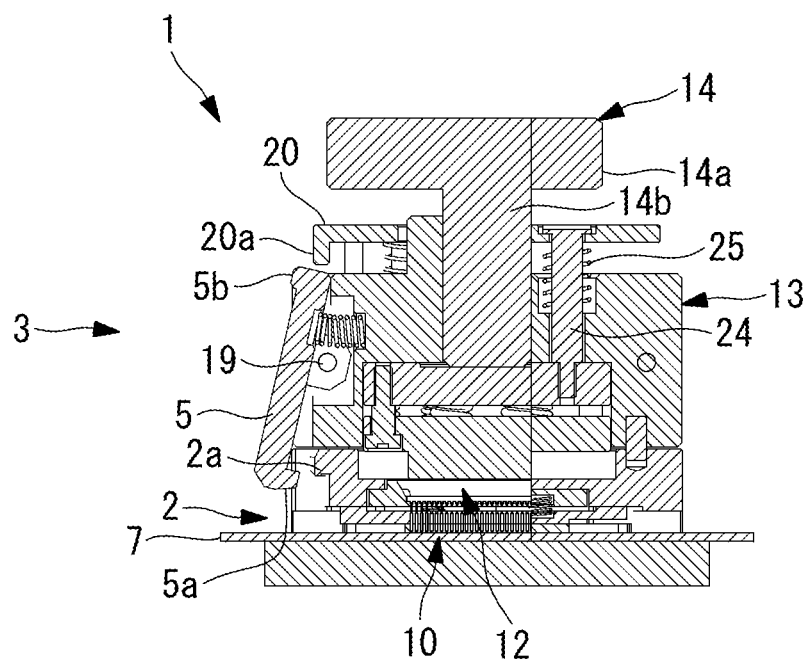
FIG. 7 is a vertical cross-sectional view in which the stopper is in an open state and the manipulating member is in a retracted state.

FIG. 7 shows a state in which the stopper 5 is in an open state, that is, the engaging portion 5a is separated from the engaged portion 2a and is in a released state, and the manipulating member 14 is retracted upward and is not pressing the IC package, that is a test device.

Upon completion of the test of the IC package, the user manipulates the knob part 14a to move the shaft part 14b upward. Accordingly, the pressing body 12 also moves upward and releases the pressing force with respect to the IC package. As the pressing body 12 moves upward, the lock part 20 also moves upward and separates from the upper surface of the lid-part main body 13. At this time, the insertion portion 20a of the lock part 20 is retracted from the gap G between the proximal end portion 5b of the stopper 5 and the side surface of the lid-part main body 13. Hence, the engaging portion 5a can be released from the engaged portion 2a by swinging the stopper 5.

The position of the pressing body 12 when the insertion portion 20a is retracted from the gap is a position where the pressing body 12 is separated from the contact terminals 10 and the connection is electrically canceled when the IC package is not mounted in the housing-part main body 2. In other words, a length (insertion margin) of the insertion portion 20a is inserted into the gap G from the contact position where the pressing body 12 contacts the contact terminals 10 when the IC package is not mounted in the housing-part main body 2, for a period of time until the pressing body 12 is separated and disconnected from the contact terminals 10.

As described above, according to the present embodiment, the following functions and effects are obtained.

The stopper 5 connects the lid-part main body 13 and the housing-part main body 2 by engagement with the engaged portion 2a of the housing-part main body 2 at the engaging portion 5a of the distal end. Since the stopper 5 is attached in a swingable fashion at the intermediate point to the lid-part main body 13 by the pin 19, the proximal end portion 5b of the stopper 5 is separated from the side surface of the lid-part main body 13 when the engaging portion 5a engages with the engaged portion 2a. In this state, the gap G is formed between the proximal end portion 5b and the side surface of the lid-part main body 13. The insertion portion 20a is inserted into the gap G, and also the insertion portion 20a is inserted according to the action of the pressing body 12 pressing the IC package 4. Thus, since the movement of the proximal end portion 5b approaching toward the side surface of the lid-part main body 13 is restricted, the engaging portion 5a of the stopper 5 also cannot move and continues to maintain the engagement with the engaged portion 2a. Therefore, during pressing with the pressing body 12, that is, during a test of the IC package 4, it is possible to prevent a mistaken manipulation by which the stopper 5 is disengaged and the housing-part main body 2 and the lid-part main body 13 (and eventually the lid part 3) are unintentionally separated from each other.

The lock part 20 is provided so as to reciprocate together with the pressing body 12, and the insertion portion 20a is provided on the lock part 20. Thus, by just adding the lock part 20, it is possible to prevent a mistaken manipulation by which the stopper 5 is unintentionally disengaged during pressing.

The lock part 20 is arranged so that the lid-part main body 13 is interposed between the lock part 20 and the pressing body 12. Hence, since the pressing body 12, the lid-part main body 13 and the lock part 20 can be placed in a stacked manner in the direction of the center axis line L1, the socket 1 can be compactly configured without a significant change in the outer shape.

When the IC package 4 is not housed in the device housing portion 9, the contact terminals 10 and the pressing body 12 may come into direct contact with each other. At this time, if the pressing body 12 is conductive, there is a possibility of occurrence of a short circuit between the contact terminals 10 and the board 7 through the pressing body 12. Therefore, the insertion portion 20a is inserted into the gap from the contact position where the pressing body 12 contacts the contact terminals 10 when the IC package 4 is not mounted in the device housing portion 9, for a period of time until the pressing body 12 is separated and disconnected from the contact terminals 10. Consequently, it is possible to prevent a short circuit and avoid breakage of the socket 1 and the board 7.

Second Embodiment

Next, a second embodiment of the present invention will be described using FIG. 10.

The present embodiment is different from the first embodiment in an aspect that the lock part 20 is changed. Thus, since the other structures are the same, description thereof will be omitted.

Figure 10:
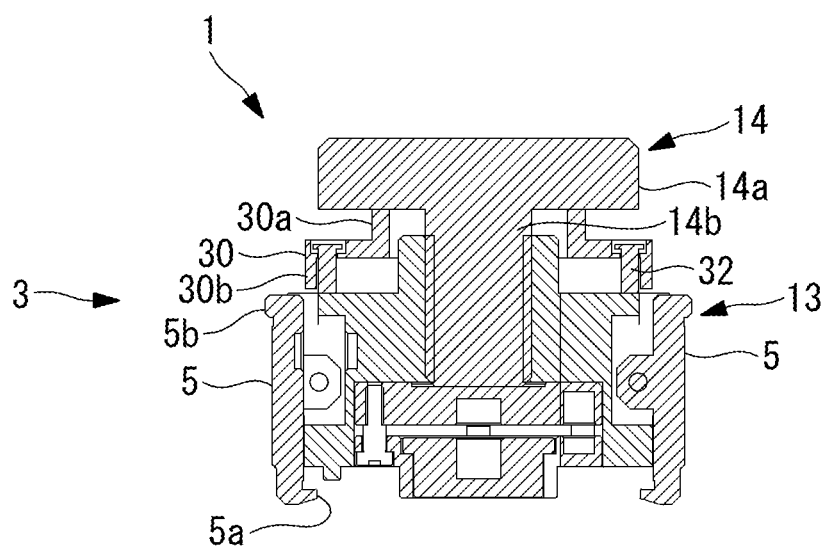
FIG. 10 is a vertical cross-sectional view showing a lid part of a socket according to a second embodiment of the present invention.

In FIG. 10, the lid part 3 of the socket 1 is shown. An intermediate member 30 is provided between the knob part 14a of the manipulating member 14 and the lid-part main body 13. The intermediate member 30 is a plate-like body extending in the horizontal direction, and has a protruding portion 30a upstanding at the center. The upper end of the protruding portion 30a abuts against the lower surface of the knob part 14a.

Each of both sides of the intermediate member 30 is provided integrally with an insertion portion 30b protruding downward. A plurality of guide bolts 32 are inserted into the intermediate member 30, and the intermediate member 30 reciprocates in the vertical direction along the guide bolts 32. A coil spring (not shown) is interposed between the intermediate member 30 and the lid-part main body 13 to urge the intermediate member 30 toward the knob part 14a. Therefore, the intermediate member 30 moves up and down with the reciprocation of the knob part 14a in the vertical direction.

According to the present embodiment, the intermediate member 30 that contacts the knob part 14a is provided between the knob part 14a of the manipulating member 14 and the lid-part main body 13. Moreover, the intermediate member 30 is provided with the insertion portion 30b. Hence, the insertion portion 30b provided on the intermediate member 30 can be inserted into the gap G between the proximal end portion 5b of the stopper 5 and the side surface of the lid-part main body 13 according to the action of the manipulating member 14, thereby preventing a mistaken manipulation by which the stopper 5 is unintentionally disengaged during pressing.

Third Embodiment

Next, a third embodiment of the present invention will be described using FIGS. 11 and 12.

The present embodiment is different from the first embodiment in an aspect that the lock part 20 is changed. Thus, since other structures are the same, description thereof will be omitted.

Figure 11:
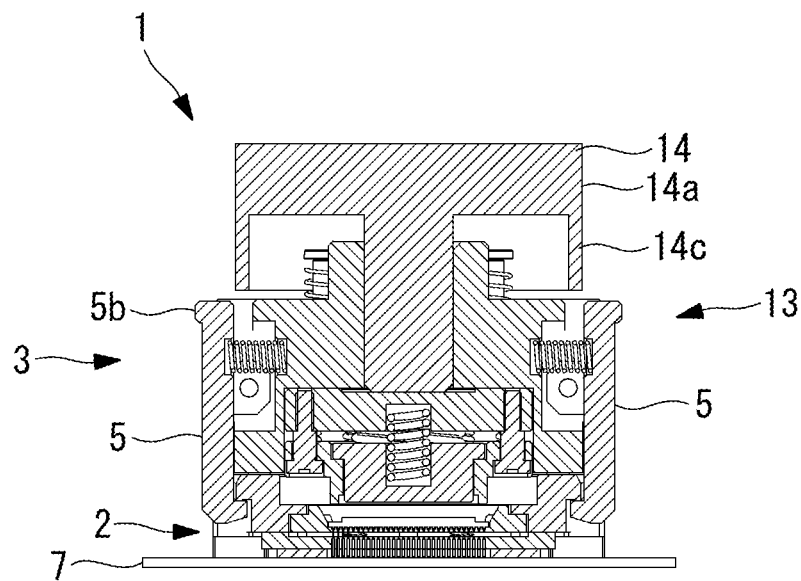
FIG. 11 is a vertical cross-sectional view showing a socket according to a third embodiment of the present invention.
Figure 12:
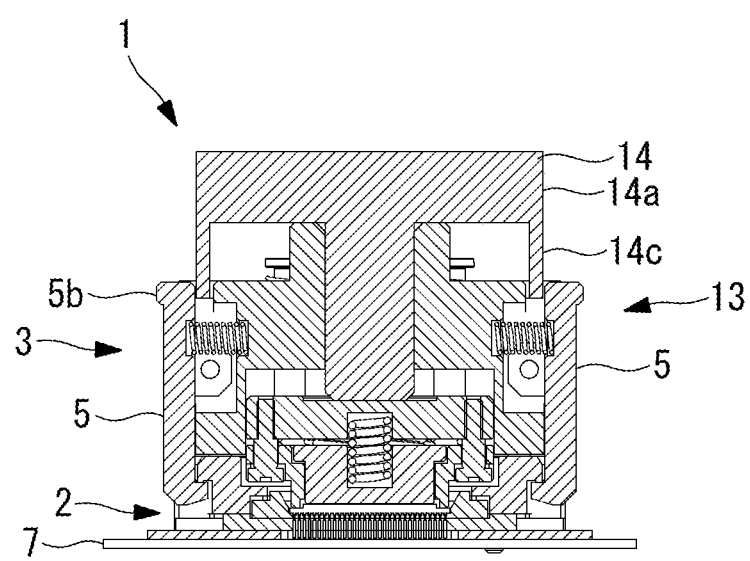
FIG. 12 is a vertical cross-sectional view showing a state in which an insertion portion of the socket of FIG. 11 is inserted into a gap.

As shown in FIG. 11, an insertion portion 14c protruding downward is integrally provided around the knob part 14a of the manipulating member 14. As shown in FIG. 12, with the downward movement of the manipulating member 14, the insertion portion 14c is inserted into the gap between the proximal end portion 5b of the stopper 5 and the side surface of the lid-part main body 13.

According to the present embodiment, the insertion portion 14c is formed on the knob part 14a of the manipulating member 14. Hence, the insertion portion 14c can be inserted into the gap G between the proximal end portion 5b of the stopper 5 and the side surface of the lid-part main body 13 during pressing, thereby preventing a mistaken manipulation by which the stopper 5 is unintentionally disengaged during pressing.

In addition, since the insertion portion 14c is formed on the knob part 14a of the manipulating member 14, the insertion portion can be realized without introducing a separate component part, thereby reducing the number of component parts.

Fourth Embodiment

Next, a fourth embodiment of the present invention will be described using FIG. 13.

This embodiment is different from the first embodiment in the structure of pressing the pressing body. The differences from the first embodiment will be described below.

Figure 13:
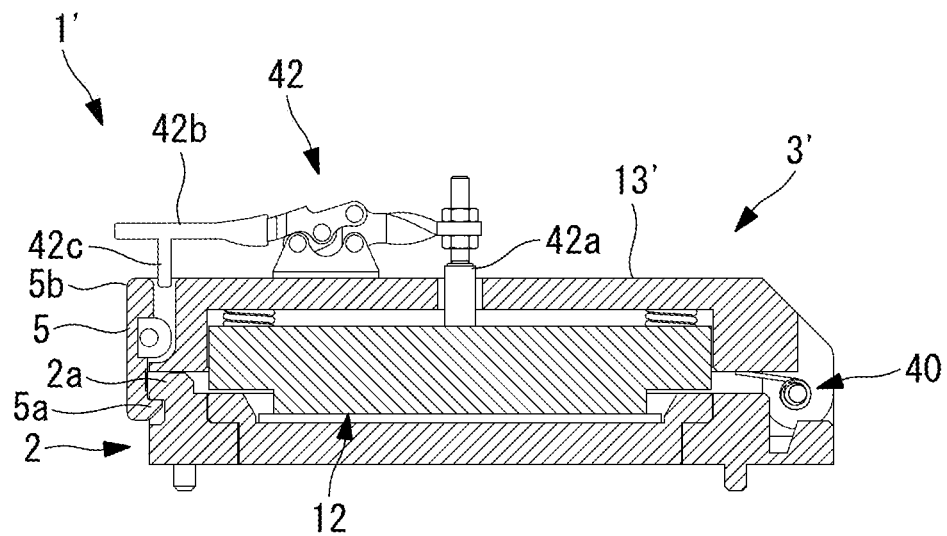
FIG. 13 is a vertical cross-sectional view showing a socket according to a fourth embodiment of the present invention.

As shown in FIG. 13, a lid part 3' is configured to turn on a hinge part 40. That is, a socket 1' of the present embodiment is of a clamshell type having the turning lid part 3'.

The lid part 3' includes a lid-part main body 13', and a toggle clamp 42 fastened on the lid-part main body 13'.

The hinge part 40 is mounted at one end of the lid-part main body 13', and the stopper 5 is provided at the other end (left side in the drawing). Like the first embodiment, the stopper 5 has the engaging portion 5a at the lower end and comes into engagement with the engaged portion 2a of the housing-part main body 2.

The toggle clamp 42 includes a shaft part 42a at one end, and a lever part 42b at the other end. By manipulating the lever part 42b, the tip portion (lower end portion) of the shaft part 42a abuts against and presses the pressing body 12.

The lever part 42b has an insertion portion 42c provided in a direction protruding downward when the lever part 42b is in a pressed state. The insertion portion 42c is inserted into the gap G between the proximal end portion 5b of the stopper 5 and the side surface of the lid-part main body 13'.

According to the present embodiment, by providing the toggle clamp 42 on the lid-part main body 13', the pressing body 12 is pressed in a direction toward the board. The lever part 42b of the toggle clamp 42 is provided with the insertion portion 42c. Hence, when pressing the pressing body 12 with the toggle clamp 42, the insertion portion 42c provided on the lever part 42b can be inserted into the gap G between the proximal end portion 5b of the stopper 5 and the side surface of the lid-part main body 13', thereby preventing a mistaken manipulation by which the stopper 5 is unintentionally disengaged during pressing.

Modified Example 1

Figure 14A:
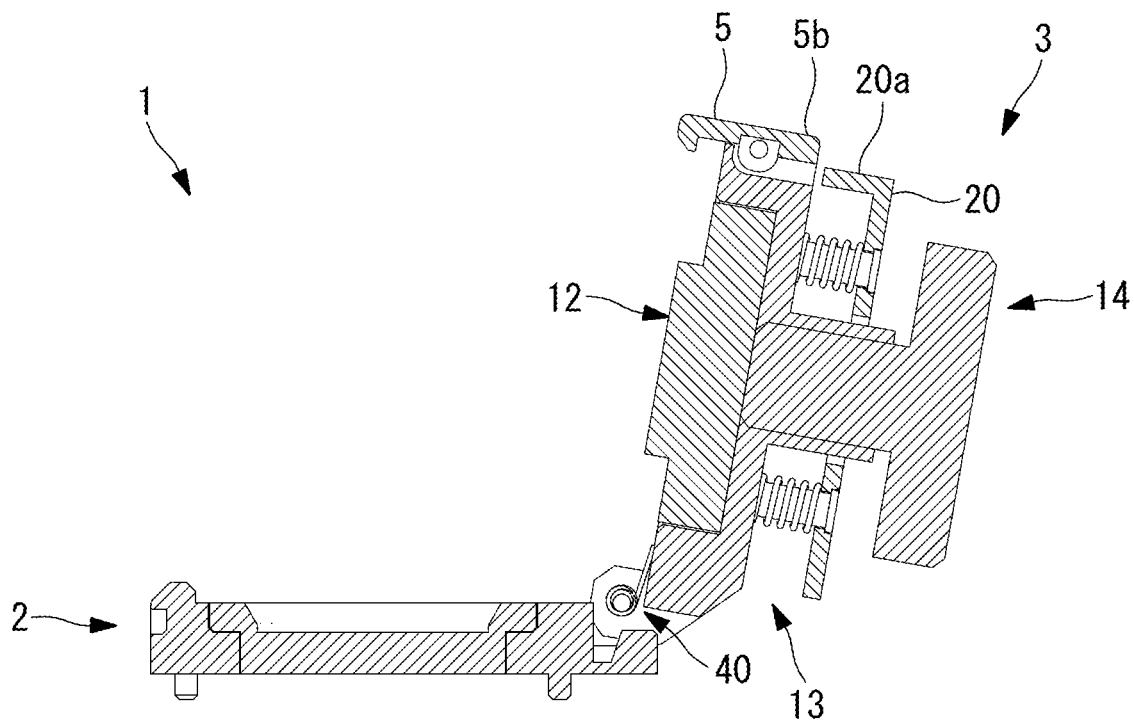
FIG. 14A is a vertical cross-sectional view of Modified Example 1 of the first embodiment, showing a state in which the lid part is opened.
Figure 14B:
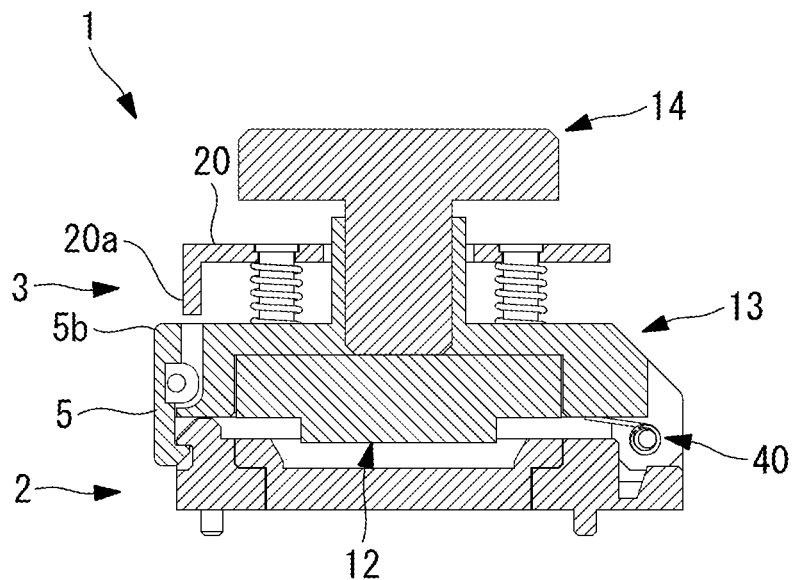
FIG. 14B is a vertical cross-sectional view showing a state in which the lid part of the socket of FIG. 14A is closed.
Figure 14C:
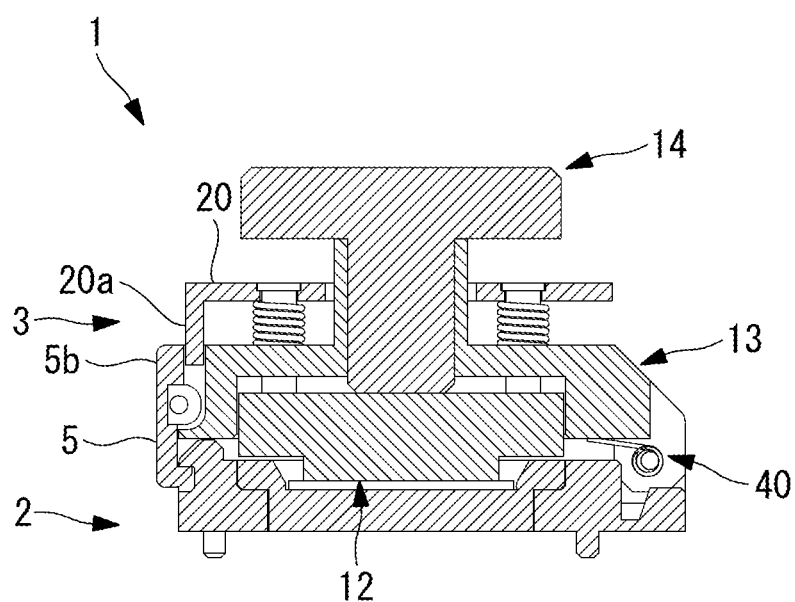
FIG. 14C is a vertical cross-sectional view showing a state in which the insertion portion of FIG. 14B is inserted into the gap.

The first embodiment can be modified into the clamshell type shown in the fourth embodiment. Specifically, as shown in FIGS. 14A to 14C, the lid part 3 may be turned on the hinge part 40. FIG. 14A shows a state in which the lid part 3 is in an opened state with respect to the housing-part main body 2. After closing the lid part 3 with respect to the housing-part main body 2, the insertion portion 20a is inserted into the gap between the proximal end portion 5b of the stopper 5 and the side surface of the lid-part main body 13 to change from the state of FIG. 14B to the state of FIG. 14C.

Modified Example 2

Figure 15A:
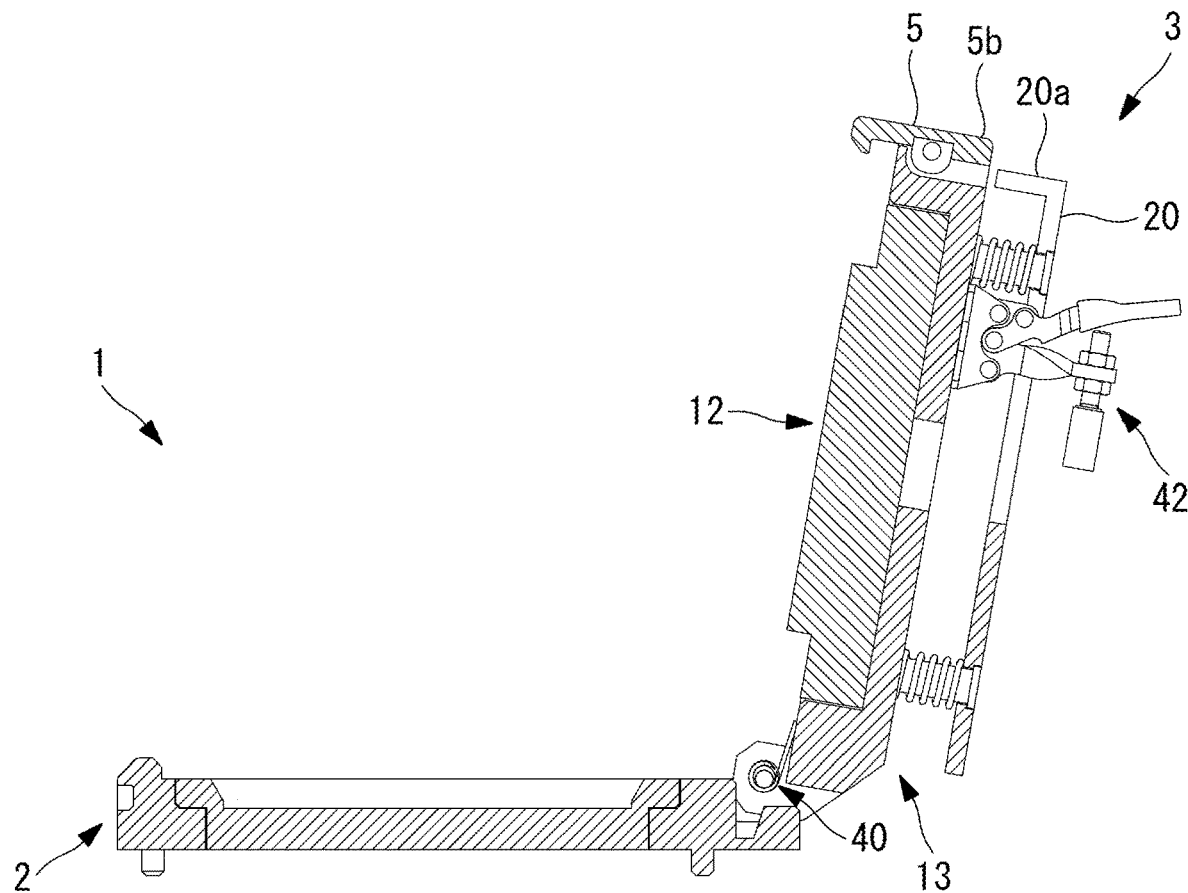
FIG. 15A is a vertical cross-sectional view of a socket according to Modified Example 2 of the socket of the first embodiment, showing a state in which the lid part is opened.
Figure 15B:
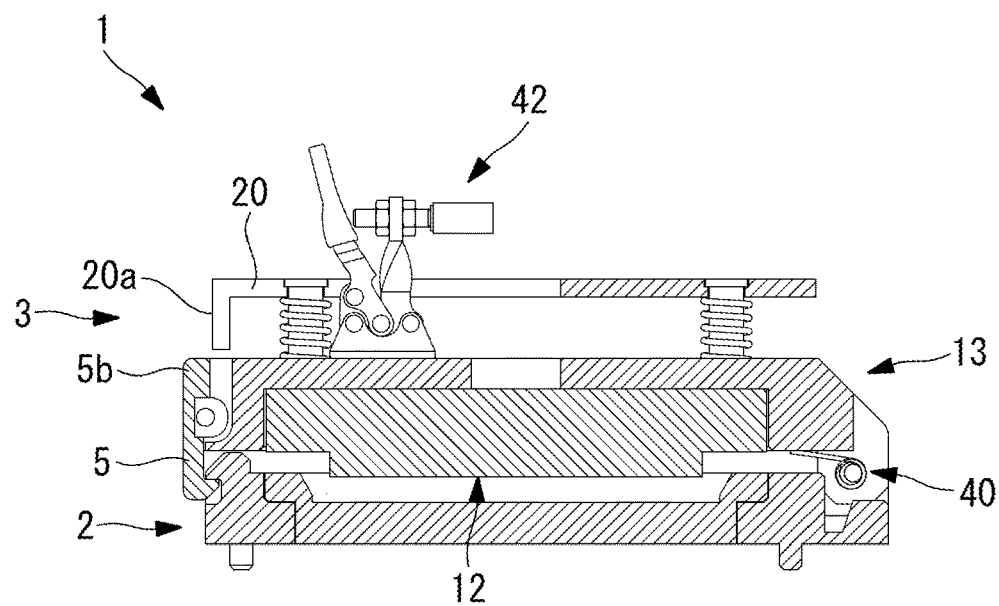
FIG. 15B is a vertical cross-sectional view showing a state in which the lid part of the socket of FIG. 15A is closed, before the insertion portion is inserted into the gap.
Figure 15C:
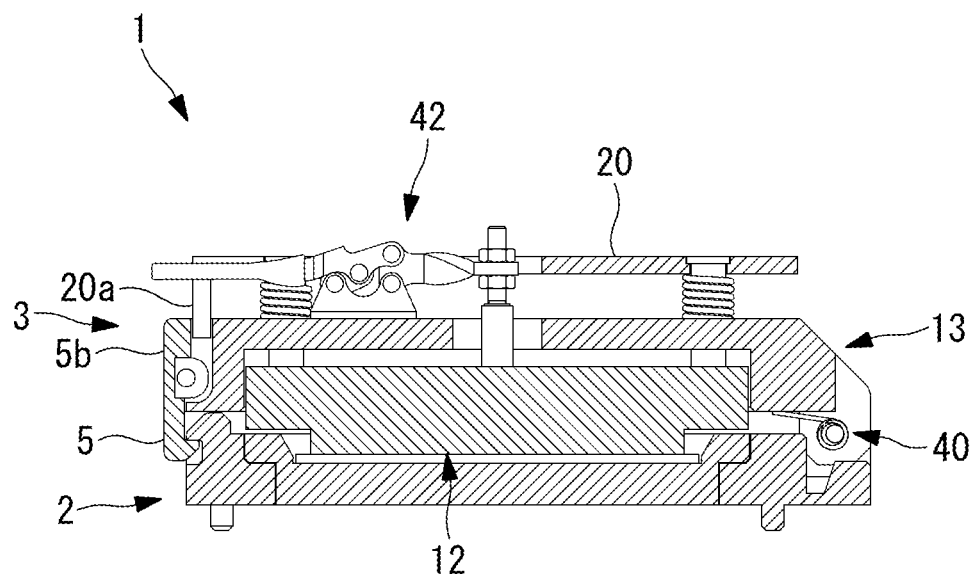
FIG. 15C is a vertical cross-sectional view showing a state in which the lid part of the socket of FIG. 15A is closed and the insertion portion is inserted into the gap.

Instead of the manipulating member 14 of the Modified Example 1, the toggle clamp 42 may be adopted. FIG. 15A shows a state in which the lid part 3 is in an opened state with respect to the housing-part main body 2. After closing the lid part 3 with respect to the housing-part main body 2, the lock part 20 engages with the lever part 42b of the toggle clamp 42, and consequently the insertion portion 20a is inserted into the gap G between the proximal end portion 5b of the stopper 5 and the side surface of the lid-part main body 13 according to the action of the lever part 42b to change from the state of FIG. 15B to the state of FIG. 15C.

Modified Example 3

Figure 16:
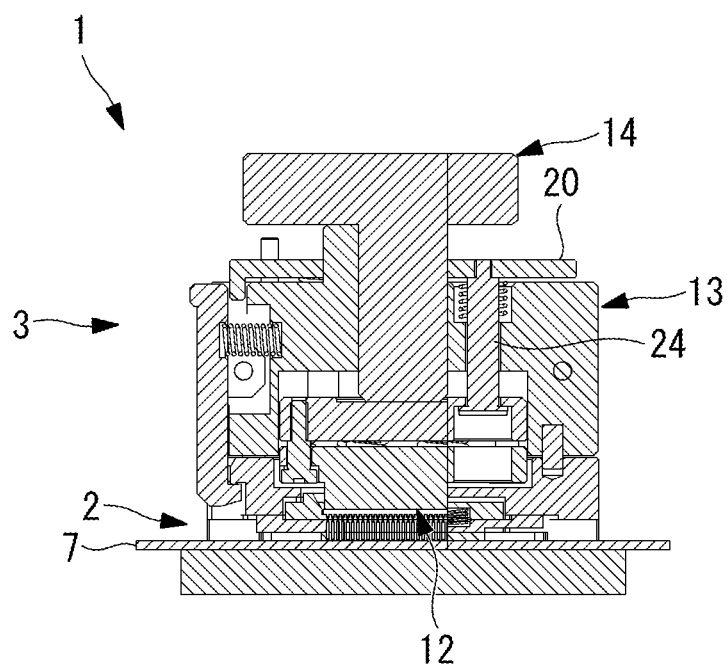
FIG. 16 is a vertical cross-sectional view showing Modified Example 3 of the socket of the first embodiment.

In the first embodiment, as shown in FIG. 2, for example, the male thread is formed on the lower end of the step bolt 24 connecting the lock part 20 and the pressing body 12 and is engaged with the female thread formed in the upper pressing body 12b. Alternatively, a male thread may be formed on the tip (upper end) of the step bolt 24 and engaged with the female thread formed in the lock part 20 as shown in FIG. 16.

As described above, according to the present invention, the stopper member for restricting the releasing action of the stopper for fastening the lid part to the housing-part main body is provided, and the releasing action of the stopper member is linked with the depressurizing action of the pressing body, and therefore, since the stopper cannot be released without depressurizing the pressing body, it is possible to safely detach the lid member.

REFERENCE SIGNS LIST 1, 1' socket (test socket)
2 housing-part main body
2a engaged portion
3, 3' lid part
4 IC package (test device)
5 stopper (engaging member)
5a engaging portion
5b proximal end portion
7 printed wiring board (board)
9 device housing portion
10 contact terminal
12 pressing body
12a lower pressing body
12a1 bottom surface
12b upper pressing body
13, 13' lid-part main body
13a storage recess
14 manipulating member
14a knob part
14b shaft part
14c insertion portion
16 coil spring
17 stopper bolt
19 pin
20 lock part (reciprocating member)
20a insertion portion
22 coil spring
24 step bolt (connecting member)
24a enlarged diameter portion
25 coil spring
30 intermediate member
30a protruding portion
30b insertion portion
32 guide bolt
40 hinge part
42 toggle clamp
42a shaft part 42*b* lever part
42*c* insertion portion
L1 center axis line While example embodiments have been particularly shown and described, it will be understood by those skilled in the art that various changes in form and details may be made therein without departing from the scope of the embodiments encompassed by the appended claims.

What is claimed is:

1. A test socket comprising:
a housing-part main body formed with a device housing portion for housing a test device and to be mounted on a board;
a pressing body pressing the test device housed in the device housing portion in a direction toward the board;
a lid-part main body holding the pressing body while allowing reciprocating movement in the direction toward and from the board, and to be connected to the housing-part main body;
an engaging member attached to the lid-part main body so that the engaging member is swingable with an intermediate point as a pivot axis, the engaging member having a distal end portion coming into engagement with the housing-part main body, and a proximal end portion approaching and separating from an opposing surface of the lid-part main body; and
an insertion portion to be inserted into a gap between the proximal end portion and the opposing surface of said lid-part main body,
the insertion portion is inserted into the gap from a position retracted from the gap according to an action of the pressing body pressing the test device in the direction toward the board.

2. The test socket according to claim 1, wherein the insertion portion is provided on a reciprocating member, the reciprocating member being fastened to reciprocate together with the pressing body.

3. The test socket according to claim 2, wherein the reciprocating member comprises a plate-like body being placed so that the lid-part main body is interposed between the plate-like body and the pressing body and extending in a direction orthogonal to a reciprocating direction, and a connecting member connecting and fastening the plate-like body and the pressing body together.

4. The test socket according to claim 1, wherein the lid-part main body comprises a housing recess housing the pressing body.

5. The test socket according to claim 1, further comprising:
a manipulating member having a tip in contact with the pressing body, and displacing the pressing body in the direction toward the board by manipulation of a knob part; and
an intermediate member provided between the knob part of the manipulating member and the lid-part main body, and contacting the knob part, wherein
the insertion portion is provided on the intermediate member.

6. The test socket according to claim 1, further comprising
a manipulating member having a tip in contact with the pressing body, and displacing the pressing body in the direction toward the board by manipulation of a knob part, wherein
the insertion portion is formed on the knob part of the manipulating member.

7. The test socket according to claim 1, wherein
the lid-part main body is provided with a toggle clamp for pressing the pressing body, and
the insertion portion is provided on a lever part of the toggle clamp.

8. A test socket according to claim 1, further comprising a contact terminal for electrically connecting the test device and the board, wherein
the pressing body is conductive, and
the insertion portion is inserted into the gap from a contact position where the pressing body contacts the contact terminal when the test device is not mounted in the device housing portion, for a period of time until the pressing body is separated and disconnected from the contact terminal.

* * * * *